United States Patent [19]

Nishioka et al.

[11] Patent Number: 5,519,631
[45] Date of Patent: May 21, 1996

[54] METHOD OF ARRANGING COMPONENTS IN SEMICONDUCTOR DEVICE

[75] Inventors: Seishi Nishioka; Atsuhiko Okada, both of Kasugai, Japan

[73] Assignees: Fujitsu Limited, Kawasaki; Fujitsu VLSI Limited, Kasugai, both of Japan

[21] Appl. No.: 469,375

[22] Filed: Jun. 6, 1995

Related U.S. Application Data

[63] Continuation of Ser. No. 194,622, Feb. 7, 1994, abandoned, which is a continuation of Ser. No. 931,506, Aug. 21, 1992, abandoned, which is a continuation of Ser. No. 492,797, Mar. 13, 1990, abandoned.

[30] Foreign Application Priority Data

Mar. 15, 1989 [JP] Japan ..................... 1-062831

[51] Int. Cl.⁶ ..................................... G06F 17/50
[52] U.S. Cl. ............................... 364/490; 364/489
[58] Field of Search .................... 364/488, 489, 364/490, 491

[56] References Cited

U.S. PATENT DOCUMENTS

| | | | |
|---|---|---|---|
| 4,577,276 | 3/1986 | Dunlop et al. | 364/491 |
| 4,630,219 | 12/1986 | Di Giacomo et al. | 364/491 |
| 4,686,629 | 8/1987 | Noto et al. | 364/491 |
| 4,694,403 | 9/1987 | Nomura | 364/488 |
| 4,805,113 | 2/1989 | Ishii et al. | 364/491 |
| 4,823,278 | 4/1989 | Kikuchi et al. | 364/491 |
| 4,924,430 | 5/1990 | Zasio et al. | 364/578 |

OTHER PUBLICATIONS

"LAS: Layout Pattern Analysis System With New Approach" by Y. Okamura et al., IEEE 1982, pp. 308–311.
"Circuit Placement for Predictable Performance" by Hauge et al., IEEE 1987, pp. 88–91.
Research Disclosure, Method to Achieve Equal Capacitance on a Group of Nets During Circuit Layout and Placement, Mar. 1989, New York, NY, US.
IBM Technical Disclosure Bulletin, Method for Controlling VLSI Chip Timing Constraints, Mar. 1988, vol. 30, No. 10, p. 172, Armonk, NY, US.
IBM Thomas J. Watson, Research Center, Circuit Placement for Predictable Performance, 1987, pp. 88–91, Yorktown Heights, New York.
Yasushi Ogawa et al., Efficient Placement Algortthms Optimizing Delay for High–Speed ECL Masterslice LST's.

*Primary Examiner*—Vincent N. Trans
*Attorney, Agent, or Firm*—Staas & Halsey

[57] ABSTRACT

A method of arranging components in a semiconductor device on a substrate (11), comprising provisionally determining a wiring path (3) so that a predetermined wiring capacitance is not exceeded in a specific network (1) and then performing a wiring process of elements (12) in the specific network within a component placement region (2) determined by the wiring path.

9 Claims, 7 Drawing Sheets

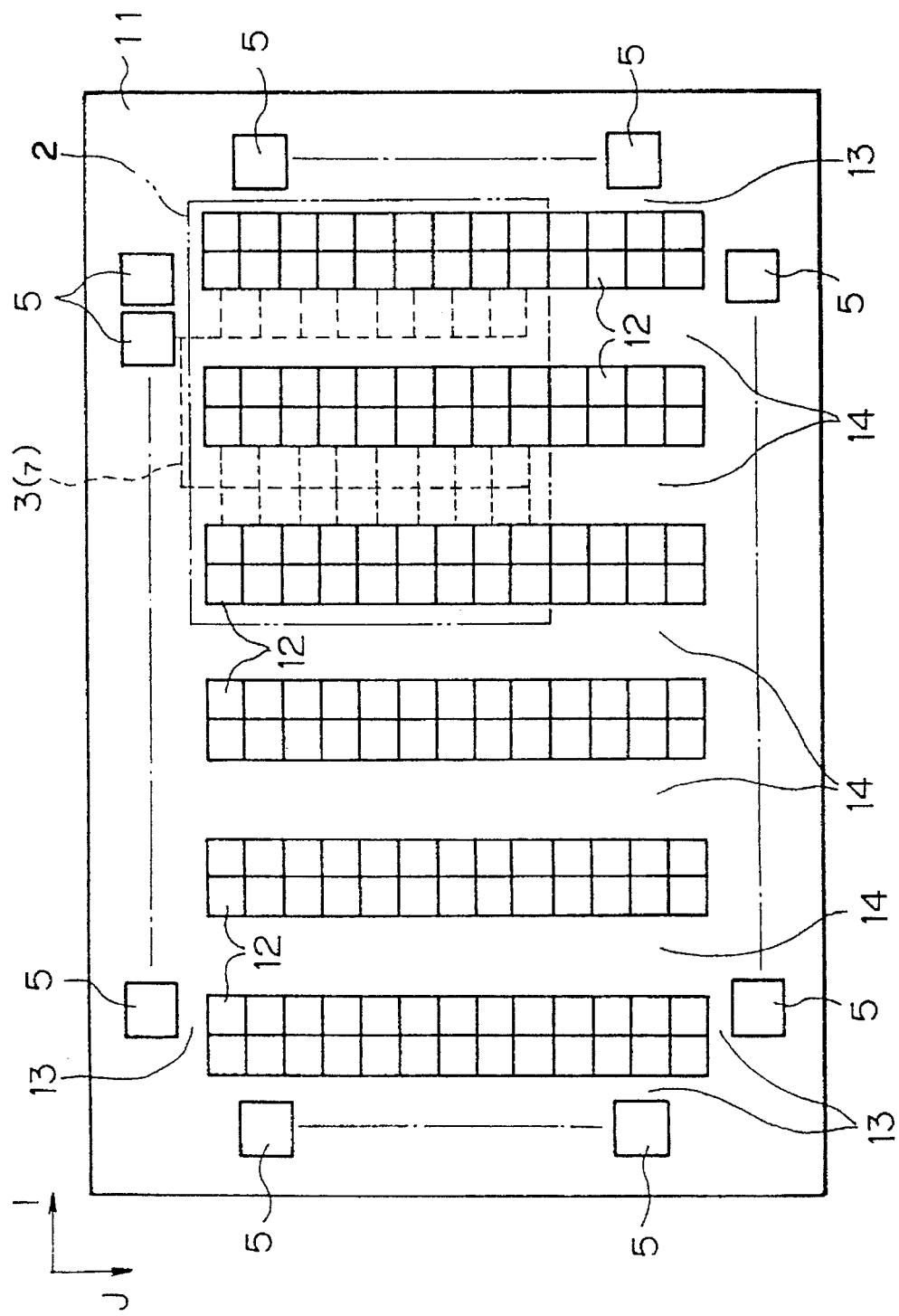

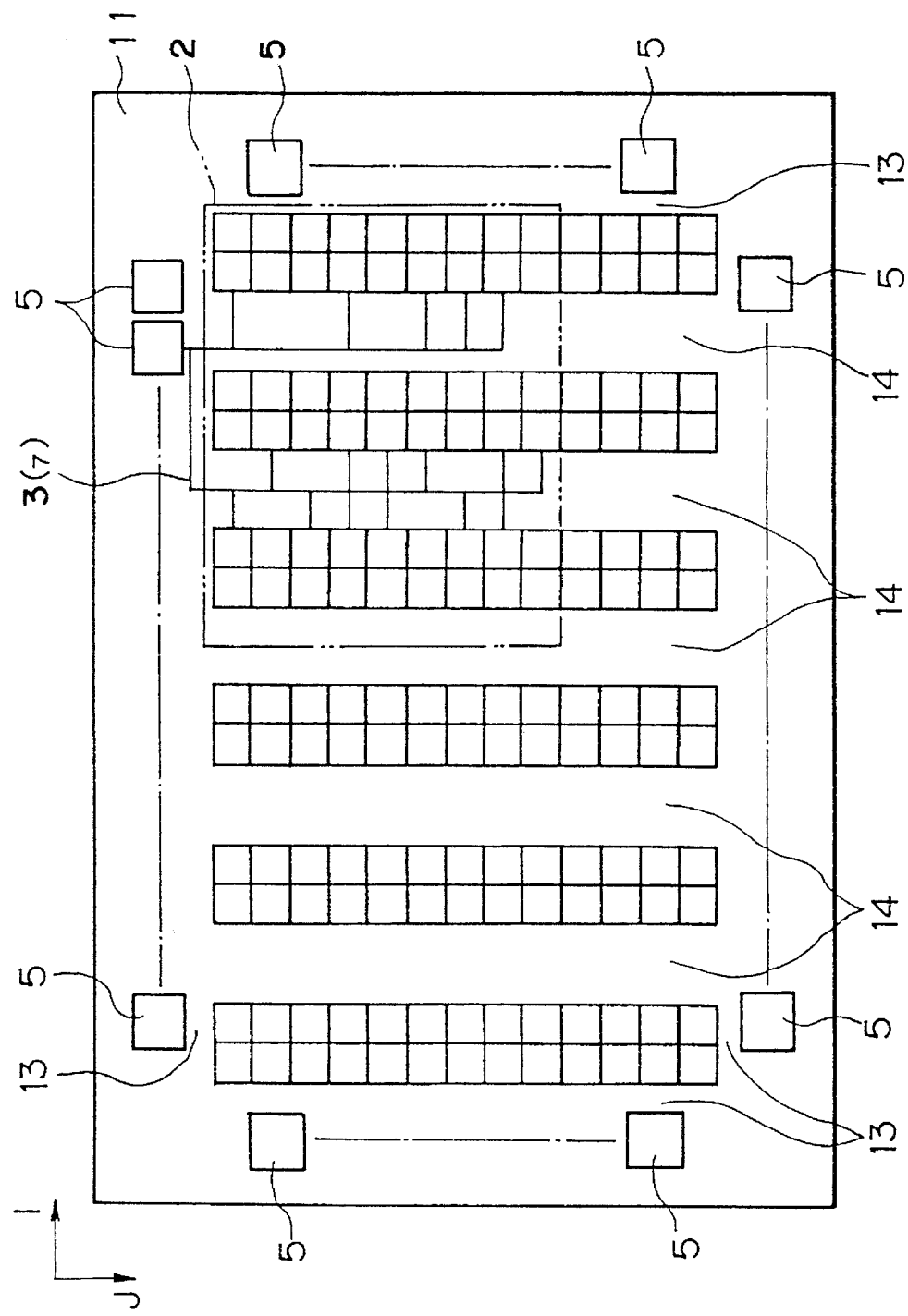

▨ F/F CELLS

▦ OTHER CELLS (FORBIDDEN REGION)

METHOD OF ARRANGING COMPONENTS IN SEMICONDUCTOR DEVICE

This application is a continuation, of application Ser. No. 08/194,622, filed Feb. 7, 1994, now abandoned, which is a continuation, of application Ser. No. 07/931,506, filed Aug. 21, 1992, now abandoned, which is a continuation, of application Ser. No. 07/492,797, filed Mar. 13, 1990, now abandoned.

BACKGROUND OF THE INVENTION

1. Field of the Invention

The present invention relates to a method of arranging components in a semiconductor device on a substrate. More precisely, it relates to a method of arranging components so that a wiring capacitance (network capacitance) of conductors connecting associated components in a specific network is lower than a predetermined value.

In a logic design of an LSI, such as a gate array, the wiring capacitance of a specific network having a high frequency or a large number of fan-outs must be carefully taken into account, and accordingly, the arrangement or location of components constituting the specific network must be carefully taken into consideration so as to satisfy the wiring capacitance of the components.

The term "component" is used as a generic term in this specification and covers various logic circuits, semiconductor elements, flip-flops, gate elements, etc.

2. Description of the Related Art

There are two known arrangements of components in a semiconductor device, such as a CMOS gate array. According to a first known arrangement algorithm, a designer designates the arrangement of the cells without considering the wiring capacitance of the specific network, so that the wiring, i.e., the conductor arrangement of the connection of the components, can be automatically determined by a computer. On the other hand, in a second known algorithm arrangement, the arrangement and the electrical connection of the components are automatically determined by a computer, and thereafter, the wiring capacitance is computed to adjust the arrangement of the components and the wiring so that the wiring capacitance cannot exceed a predetermined value.

In the first mentioned arrangement, however, since the wiring capacitance in the specific network is not taken into account, the path of the conductors depends on the conductor arrangement of the circumferential components, and this results in a difficulty in obtaining a desired wiring capacitance by a designer. As a result, an electrical defect, such as electromigration, may occur.

In the latter arrangement, the arrangements of the components and the wiring must be manually modified, but this is troublesome and time-consuming.

The primary object of the present invention is to provide a method of arranging components in a semiconductor device in such a way that no rearrangement of the components and no rewiring are necessary, and by which the component arrangement can be determined and the wiring can be effectively conducted so as not to exceed a designer's intended wiring capacitance.

SUMMARY OF THE INVENTION

To achieve the above object, according to the present invention, there is provided a method of arranging components in a semiconductor device, comprising provisionally determining a wiring path that will not exceed a predetermined wiring capacitance in a specific network and then wiring the components into the specific network within a component placement region determined by the wiring path.

Preferably, the components in the specific network are flip-flops (F/F elements) connected to an associated one of clock I/O elements surrounding the F/F elements.

According to the present invention, since the wiring capacitance of the component placement region from the I/O element is lower than a predetermined wiring capacitance, an intended wiring capacitance can be obtained as long as the designer arranges the components in the specific network within the component placement region. Furthermore, since the component placement region specifies only the wiring capacitance, it is not necessary to precisely position the components constituting the specific network, and thus a degree of freedom exists in the arranging of the components within the component placement region, taking the connection relationship of other components into account.

BRIEF DESCRIPTION OF THE DRAWINGS

The invention will be described below in detail with reference to the accompanying drawings, in which:

FIGS. 1A and 1B are schematic views of a semiconductor device having a substrate on which components are placed in a predetermined arrangement;

DESCRIPTION OF THE PREFERRED EMBODIMENTS

Figure 2:
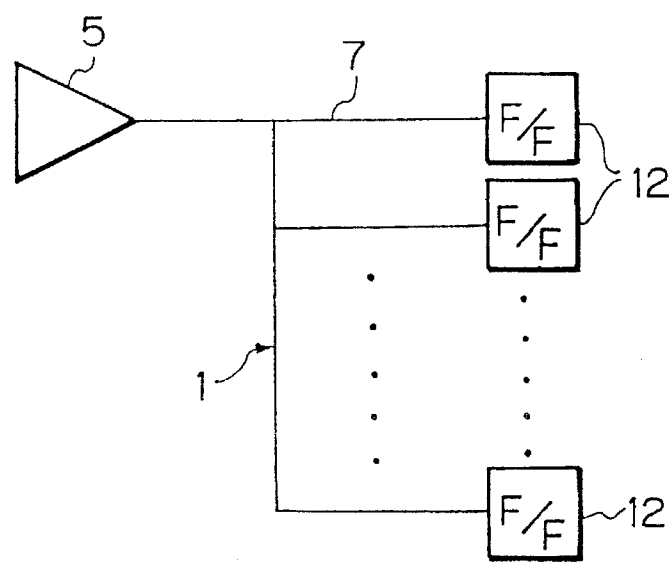
FIG. 2 is a schematic view of a circuit construction of a semiconductor device shown in FIG. 1.

As shown in FIGS. 1A, 1B and 2, a substrate 11 has a plurality of arrays of components 12, which are flip-flops (F/F elements) in the illustrated embodiment. The row (horizontal direction) and column (vertical direction) of the array are designated by I and J, respectively. Namely, in the illustrated embodiment, the substrate has 12 rows of F/F elements, and each row has 13 columns of elements (12I× 13J).

The substrate 11 also has a plurality of clock I/O cells 5 located in the vicinity of the circumferential edge of the substrate 11 and surrounding the F/F elements 12. The spaces 13 between the rows of F/F elements 12 and the I/O elements 5 and the spaces 14 10 between the rows of F/F elements 12 and the I/O elements 5 define wiring regions.

Upon determining the placement of the elements 12 constituting a specific network 1 (FIG. 1B) and the wiring of the F/F elements 12 to a specific I/O element 5 associated therewith on the substrate 11, a desired wiring capacitance of the specific network 1 is precalculated to preferentially set a component placement region 2 (FIG. 1B).

Thereafter, as shown in FIG. 1A, a wiring path 3 is assumed to be such that the wiring capacitance from the specific I/O element 5 (which is usually an I/O element 5 closest to the component placement region 2) is lower than the predetermined value mentioned above, in the wiring regions 13 and 14. Namely, the adjacent cells 12 are successively connected by a conductor 7 until the wiring capacitance reaches but does not exceed the predetermined value, while taking electromigration into consideration.

Thereafter, when the wiring path 3 is determined such that the wiring capacitance is lower than and closest to the predetermined wiring capacitance, all of the elements 12 connected to each other by the assumed wiring path 3 define the component placement region 2. Subsequently, as can be seen in FIG. 1B, the wiring of the elements 12 in the specific network 1 is performed within the component placement region 2, and finally, the connection (wiring) of the elements 12 to the specific I/O element 5 is carried out to thereby complete the specific network 1.

As can be understood from the above, in the present invention, the component placement region 2 is that in which the wiring capacitance is lower than a predetermined wiring capacitance, and accordingly, as long as a design is such that the placement of the elements 12 in the specific network 1 is within the component placement region 2, neither an adjustment of the placement of the elements 12 nor rewiring are necessary, resulting in an increased efficiency of the component placement and wiring operations. Further, the component placement and the wiring can be determined such that the predetermined wiring capacitance is not exceeded.

Note, the component placement region 2 specifies only the wiring capacitance, and thus it is not necessary to precisely position the elements 12 constituting the specific network 1.

It should be also understood that, although the above description is directed to the determination of one component placement region 2 for a predetermined wiring capacitance, it is also possible to select an optimum component placement region for a predetermined wiring capacitance from among a plurality of component placement regions obtained, by changing the direction of the extension of the conductors of the elements 12 (wiring).

The following description provides more details of the component placement process and wiring process, by way of an example.

Figure 3:
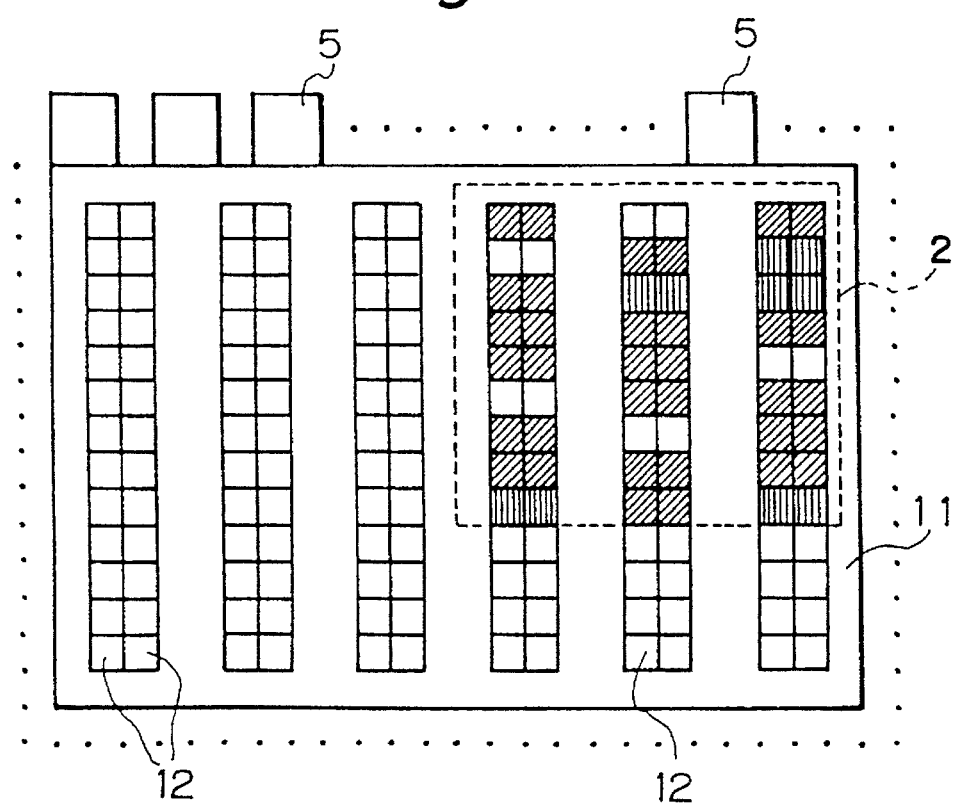
FIG. 3 is a schematic diagram of a semiconductor device after the component placement is completed, according to the present invention, by way of an example.

FIG. 3 shows the clock I/O elements 5 and the F/F elements 12 on the substrate 11, wherein regions represented by an oblique hatching and vertical hatching designate the associated F/F elements 12 in the objective region (specific network 1) and other F/F elements (forbidden region), which are of no concern, respectively.

Figure 10:
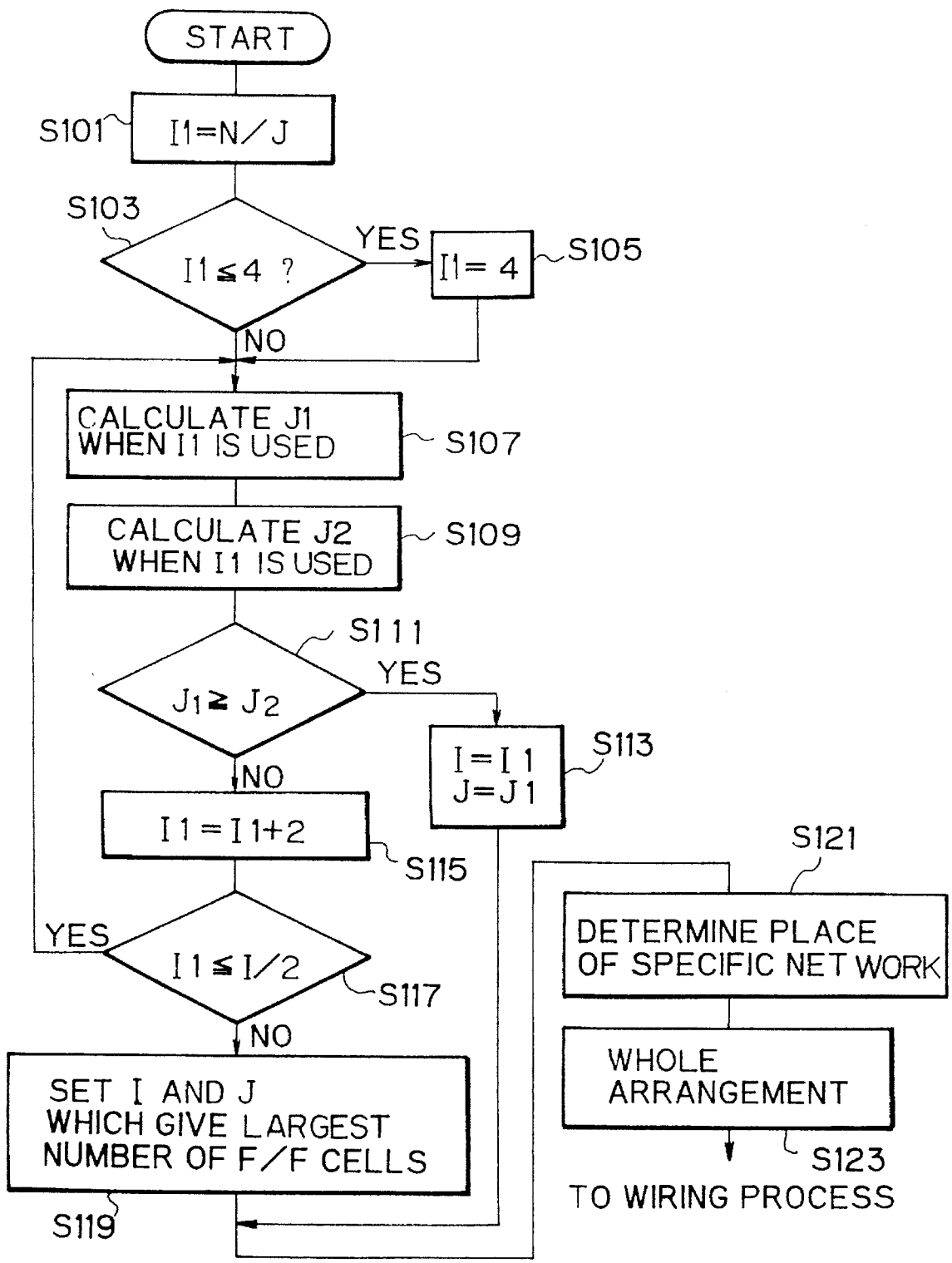
FIG. 10 is a flow chart of the placement process of the components according to an aspect of the present invention; and, FIGS. 11A and 11B are a flow chart of the wiring process of the components according to an aspect of the present invention.
Figure 11A:
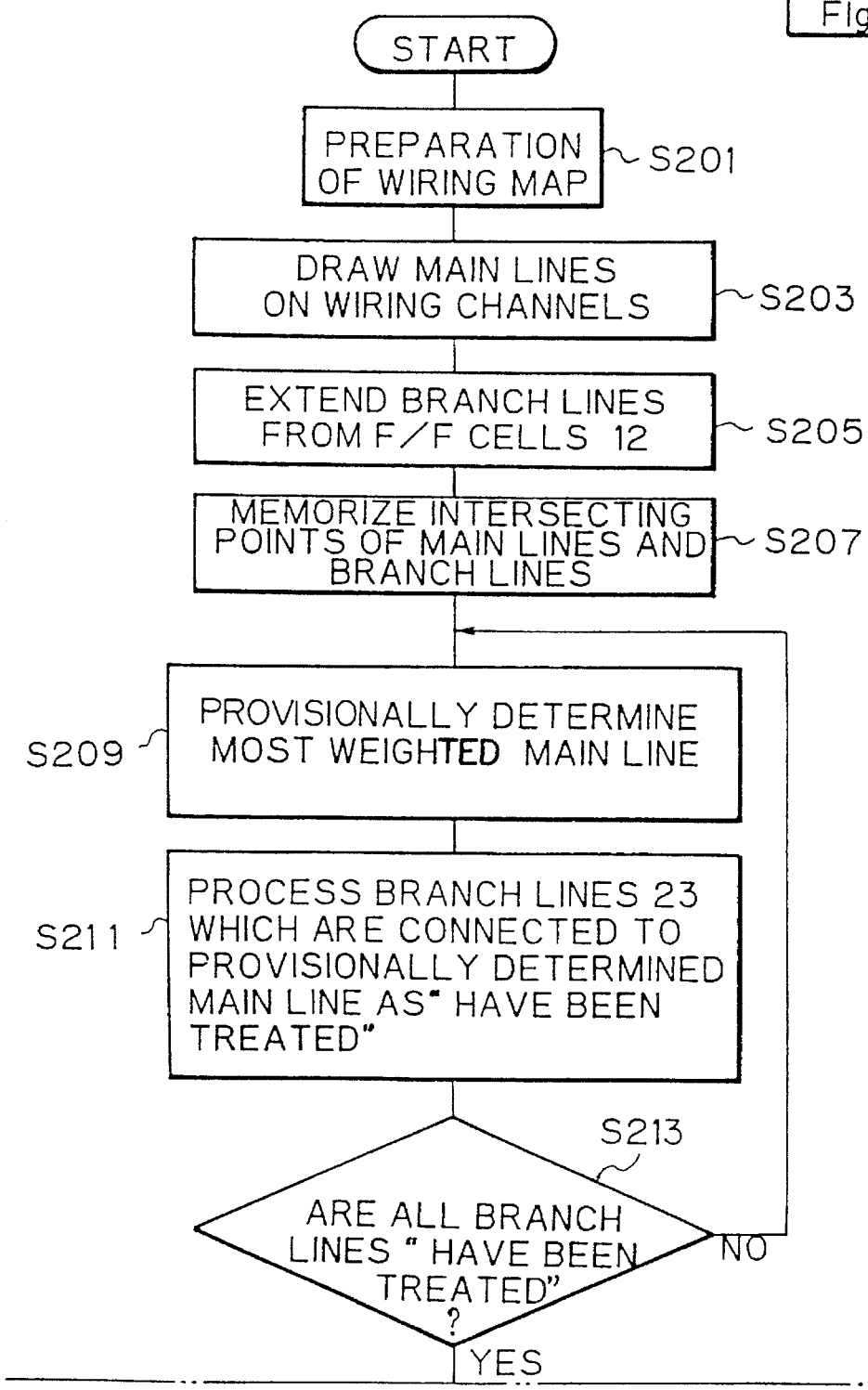
Figure 11B:
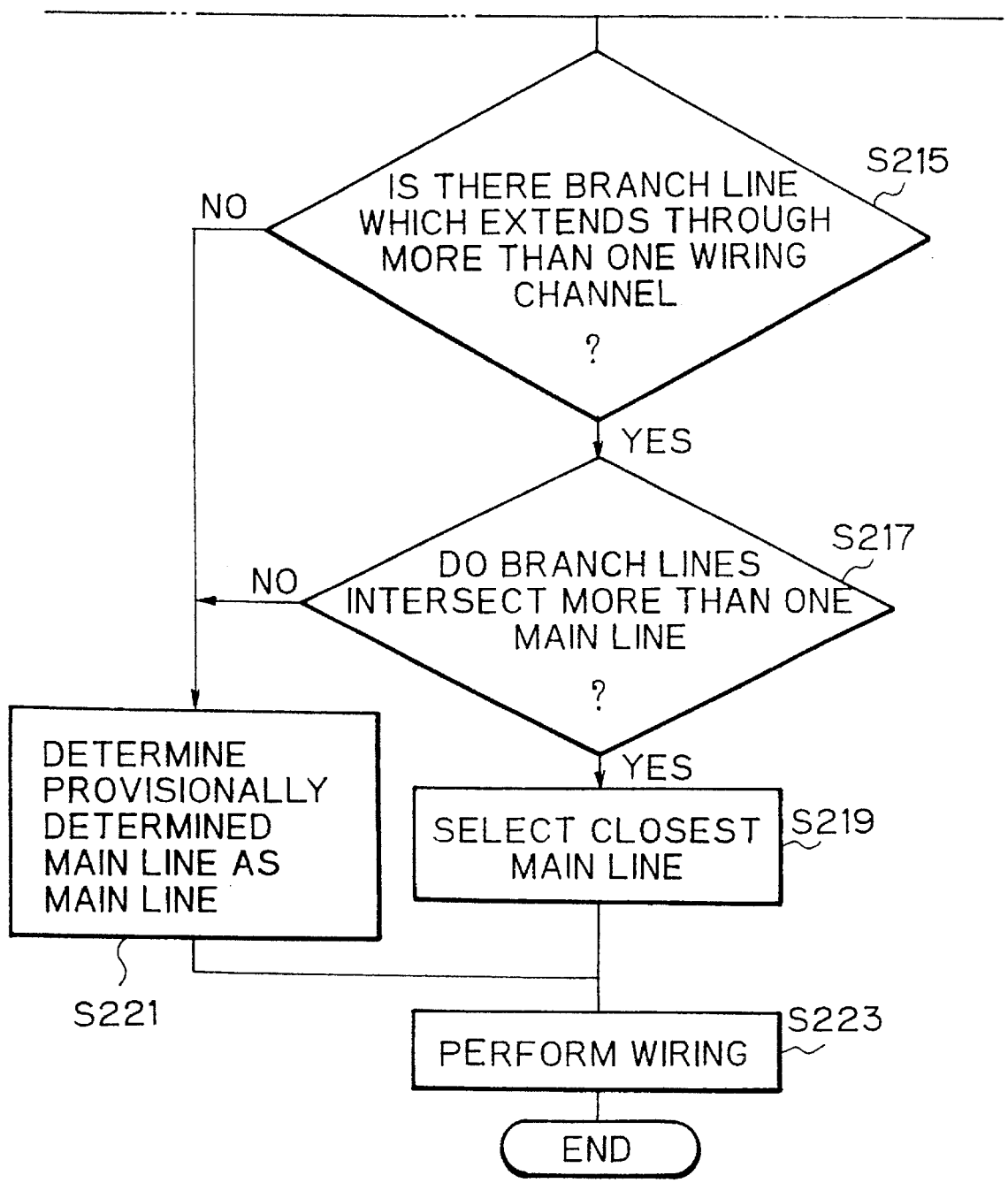

With reference to the flow chart shown in FIGS. 10 and 11, assuming that the F/F elements 12 represented by the oblique hatching in the objective region (specific network) 1 are to be connected to the specific clock I/O element 5 closest to the objective region 1, as shown in FIG. 3, the number I1 of rows I of the elements 12 needed when placing all of the F/F element 12 when a predetermined number of columns J is used is first calculated at step S101. In the illustrated embodiment, the total number N of the F/F elements 12 (i.e., the number of regions represented by the oblique hatching in FIG. 3) is 34 (N=34), and the predetermined number of columns, i.e., a total number of columns of the substrate 11, is 13 (i.e., J=13). The necessary number I1 of rows is given by the equation: I1=N/J.

Thereafter, at step S103, it is determined whether I1 is larger than a predetermined number, for example, 4. If I1 is equal to or smaller than 4, the control proceeds to step S105, at which I1 is made 4 (I1=4). If I1 is larger than 4 at step S103, the necessary number J1 of columns J needed when placing all of the F/F elements 12 when the necessary number I1 of rows is used, is calculated at step S107. Subsequently, at step S109, the necessary number J2 of columns J needed when placing all of the F/F elements 12 in accordance with a restriction imposed in view of a predetermined wiring capacitance and a predetermined drive capacitance of the associated clock I/O element 5 when the necessary number I1 of rows is used, is calculated.

Then at step S111 it is determined whether J1 is larger than J2. If J1 is equal to or larger than J2, the control proceeds to step S113 and I and J are made I1 and J1, respectively (I=I1, J=J1). If J1 is smaller than J2 at step S111, the control proceeds to step S115 and I1 is incremented by I1+2. This is because, as can be seen from FIG. 3, two rows of F/F elements 12 constitute one unit.

Thereafter, at step S117, it is determined whether or not I1 is larger than half the total number of rows I (the total number of rows is 12 in the illustrated embodiment). If I1≦I/2, the control returns to step S107. Conversely, if I1>I/2, at step S119 I and J are made values giving a largest number of F/F elements 12 restricted as mentioned above to within from 4 to I/2.

Then, at step S121, the location of the specific network 1 is determined in accordance with the location of the associated clock I/O element 5 on the substrate (semiconductor tip) 11 so that, in step S123, the F/F elements 12 to be connected to the associated clock I/O element 5 are arranged in the thus determined specific network.

After the completion of the arrangement of all of the F/F elements 12, the wiring process is performed by the steps shown in FIG. 11.

Figure 4:
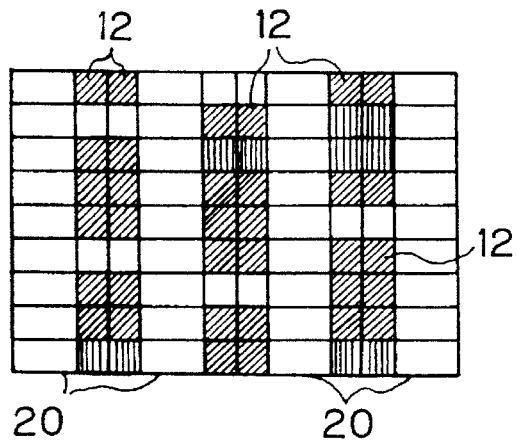
FIG. 4 is a diagram of a map showing an arrangement of components, by way of an example.
Figure 5:
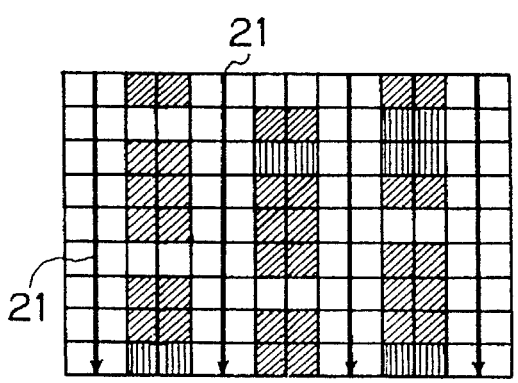
FIGS. 5 through 9 are diagrams showing consecutive steps of the wiring process according to an aspect of the present invention.
Figure 6:
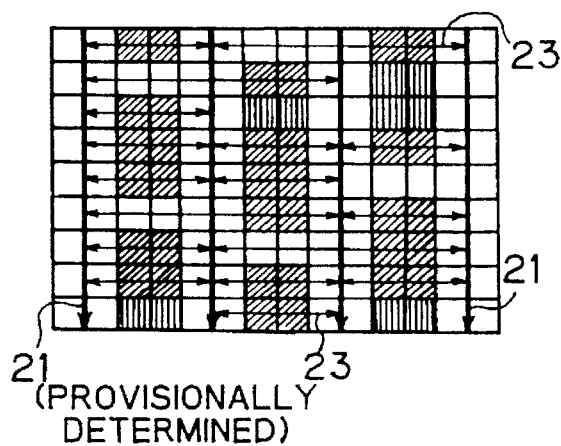
Figure 7:
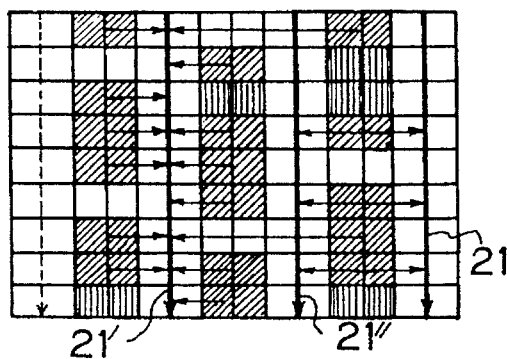
Figure 8:
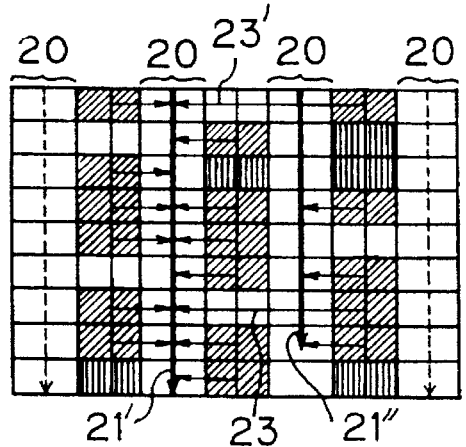

First, at step S201, a wiring map as shown in FIG. 4 is prepared for the objective region (specific network 1). FIG. 4 shows rows of F/F elements 12 and wiring channels 20 between the rows of the F/F elements 12. Thereafter, at step S203, the vertical lines (main lines) 21 are drawn on all of the wiring channels 20 in the specific network 1 (FIG. 3), as shown in FIG. 5, and then at step S205, the segments of horizontal lines (branch lines) 23 are extended from the F/F elements 12 to intersect the associated main lines 21 as shown in FIG. 6. The branch lines 23 are extended until they intersect the associated main lines 21, provided that no forbidden region exists on the extension. At step S207, the intersecting points of the branch lines 23 and the main lines 21 are memorized as a choice, and at step S209, one vertical line 21' most weighted, i.e., having a largest number of intersecting points is provisionally determined, as shown in FIG. 7. The most weighted main line 21' is the second from the left in the illustrated embodiment. After the provisional determination of the most weighted main line 21' at step S211, all of the branch lines 23 which intersect the provisionally determined main line 21' are processed as "have been treated", and thereafter, it is determined at step S213 whether or not all of the branch lines 23 have been treated. Namely, the provisional determination of the most weighted main line is effected for all of the branch lines 23 (i.e., all of the F/F elements 12). If the answer is negative at step S213, the control is returned to step S209, and the processes after step S209 are repeated until the treatment of all of the branch lines 23 is completed. In the illustrated embodiment, the main line 21" next to the main line 21' mentioned above is selected as a most weighted main line among the remaining main lines 21, at the second provisional determination of the most weighted main line, as shown in FIG. 8.

Figure 9:
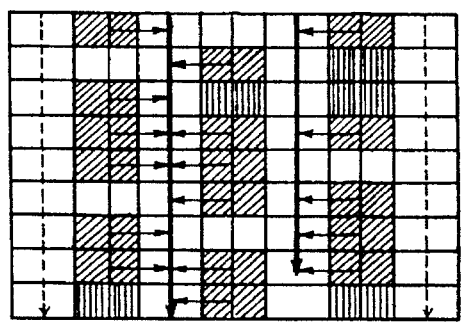

When all of the branch lines 23 have been treated, at step S215 it is determined whether a branch line 23 exists which extends through more than one wiring channel 20. In the illustrated embodiment, two branch lines 23' extend through more than one wiring channel 20. If the result at step S215 is Yes, the control proceeds to step S217 at which it is determined whether the branch line(s) intersects or intersect more than one main lines 21. If the branch line(s) intersects or intersect more than two main lines, at step S219 the closest branch line is selected as shown in FIG. 9. Thereafter, at step S221, the wiring process is carried out to connect the F/F elements 12 to the associated clock I/O element 5 by conductors; these are usually realized by a predetermined pattern of printed conductors. If no branch line extends through more than one wiring channel 20 at step S215, or if no branch line intersects more than one main line at step S217, the provisionally determined main lines are determined (selected) as the formal main lines at step S221, and thereafter, the control finally proceeds to step S223 at which the necessary wiring is carried out.

Although the elements 12 are F/F elements in the illustrated embodiment, the elements are not limited thereto, as mentioned before. Namely, the elements 12 can be logic circuits, gate elements, or other electronic elements.

As understood from the foregoing, according to the present invention, the component placement and the wiring thereof can be effectively performed so that a predetermined wiring capacitance is not exceeded, without a replacement and a rewiring of the elements.

We claim:

1. A method of arranging components in a semiconductor device on a substrate having a plurality of rows of component cell areas with wiring channels between the rows and a plurality of I/O cells, comprising the steps of:

(a) determining a number of components in a cell-placement region to be connected to a selected I/O cell, (b) calculating a wiring capacitance for connection of the selected I/O cell to the components in the cell-placement region to check whether the wiring capacitance exceeds a predetermined limit, prior to an actual connection of the components to the I/O cells;

(c) determining, after said calculating in step (b), that, when the wiring capacitance does not exceed the predetermined limit, the components in the cell-placement region should be connected to the selected I/O cell;

(d) determining, after said determining and calculating in steps (a) and (b), that, when the wiring capacitance exceeds the predetermined limit, said calculating in step (b) should be performed again after the number of the components in the cell-placement region is reduced, and repeating said calculating and determining in steps (b)–(d) until a final size of the cell-placement region is determined;

(e) assigning predetermined cell functions to provide the components in selected component cell areas within the cell-placement region;

(f) assigning wirings between the selected component cell areas and the selected I/O cell, including main conductor lines from the selected I/O cell along the wiring channels and branch conductor lines from the selected component cells to the main conductor lines;

(g) determining initial branch line connections to each of the main conductor lines in sequence from a most weighted main conductor line, having at least as many of the branch conductor lines assigned thereto in step (f) as any other of the main conductor lines, to a least weighted main conductor line, without any of the branch conductor lines initially connected to more than one of the main conductor lines;

(h) determining final branch line connections to the main conductor lines as connections of the branch conductor lines to closest main conductor lines if any of the initial branch line connections cross at least one of the wiring channels and intersects more than one of the main conductor lines;

(i) forming the I/O cells and the components in the selected component cell areas in the cell-placement region on the substrate; and (j) wiring the components in the cell-placement region to the selected I/O cell by forming the main conductor lines assigned in step (f) and the branch conductor lines to the final branch line connections determined in step (h).

2. A method of arranging components according to claim 1, wherein said substrate has a plurality of rows and a plurality of columns of the component cell areas and a plurality of clock I/O cells surrounding the the component cell areas.

3. A method of arranging components according to claim 2, wherein said calculating in step (b) includes the steps of:

(b1) calculating a number of the rows of the components needed to locate all of the components in the cell-placement region when a predetermined maximum number of the columns of the components is used; and (b2) calculating a number of the columns of the components needed to locate all of the components in the cell-placement region when the number of the rows calculated in step (b1) is used.

4. A method of arranging components according to claim 3, wherein said calculating in step (b) further includes the step of (b3) calculating the number of the columns of the components needed to locate all of the components in the cell-placement region so that a predetermined wiring capacitance is not exceeded when the number of the rows of the components calculated in step (b1) is used.

5. A method of arranging components according to claim 4, wherein said determining in step (a) includes determining placement of a specific network of the components in the cell-placement region in accordance with selection of an associated clock I/O cell as the selected I/O cell.

6. A method of arranging components according to claim 4, wherein said assigning in step (f) includes:

(f2) preparing a wiring map showing a predetermined arrangement of the components and the wiring channels between the rows of the components; and (f2) assigning the main conductor lines in the wiring channels, wherein said determining in step (g) includes the steps of:

(g1) determining the initial branch line connections from the components in the cell-placement region to the main conductor lines; and (g2) successively and provisionally selecting the most weighted main conductor line from among the main conductor lines in accordance with a number of points of intersection of the main conductor lines and the initial branch line connections, and wherein said determining in step (h) includes the step of modifying the main conductor lines provisionally selected in step (g2), taking into account lengths of the branch conductor lines connected thereto.

7. A method of wiring components on a semiconductor substrate, comprising the steps of:

(a) determining a cell placement area for cells on the semiconductor substrate, the cell placement area defined to prevent wiring therein from exceeding a predetermined wiring capacitance;

(b) integrating the components in at least some of the cells on the semiconductor substrate in the cell placement area; and (c) wiring the components in the cells integrated in step (b) along predetermined wiring paths in the cell placement area, said wiring including the substeps of:

(c1) assigning main conductor lines from an input/output cell along the predetermined wiring paths and branch conductor lines from the components towards the main conductor lines;

(c2) determining branch line connections to each of the main conductor lines in sequence from a most weighted main conductor line, having at least as many intersections with the branch conductor lines assigned in step (c1) as any other of the main conductor lines, to a least weighted main conductor line, with each the branch conductor lines connected to only one of the main conductor lines closest thereto; and (c3) wiring the components in the cell placement area to the input/output cell by forming the main conductor lines assigned in step (c1) and the branch conductor lines to the branch line connections determined in step (c2).

8. A method of wiring components on a semiconductor substrate, comprising the steps of:

(a) determining a cell placement area for cells on the semiconductor substrate, the cell placement area defined to prevent wiring therein from exceeding a predetermined wiring capacitance, including defining predetermined numbers of rows and columns of the cells with the predetermined wiring paths between the cells;

(b) integrating the components in at least some of the cells on the semiconductor substrate in the cell placement area; and (c) wiring the components in the cells integrated in step (b) along predetermined wiring paths in the cell placement area, said wiring in step (c) including the substeps of:

(c1) preparing a wiring map of a predetermined arrangement of the cells and the predetermined wiring paths between the rows of the cells;

(c2) assigning main conductor lines in the predetermined wiring paths;

(c3) determining initial branch line connections from the components in the cell placement area to the main conductor lines;

(c4) successively and provisionally selecting a most weighted main conductor line from among the main conductor lines in accordance with a number of points of intersection of the main conductor lines and the initial branch line connections;

(c5) determining final branch line connections to the main conductor lines as branch conductor lines from the components to closest main conductor lines if any of the initial branch line connections cross at least one of the wiring channels and intersects more than one of the main conductor lines; and (c6) modifying the main conductor lines provisionally selected in step (c4), taking into account lengths of the branch conductor lines connected thereto.

9. A method of arranging components in a semiconductor device on a substrate having a plurality of components and a plurality of I/O cells, comprising the steps of:

(a) calculating a wiring capacitance between one of the I/O cells and the components to check whether the wiring capacitance exceeds a predetermined limit prior to an actual connection of the components to the one of the I/O cells;

(b) determining, after said calculating in step (a), that the components are defined within a cell-placement area on the substrate, when the wiring capacitance does not exceed the predetermined limit;

(c) determining, after said calculating in step (a), that the components are defined outside of the cell placement area when the wiring capacitance exceeds the limit;

(d) assigning predetermined cell functions to the components within the cell-placement area determined in step (b) and assigning predetermined wirings between cells of the components, and between the cells and the one of the I/O cells, in accordance with the predetermined cell functions;

(e) forming the one of the I/O cell and the cells determined in steps (a) and (b), in the cell-placement area on the substrate; and (f) wiring the cells to associated I/O cells, in the cell-placement area on the substrate.

* * * * *